United States Patent
Lau

(10) Patent No.: US 9,941,871 B1
(45) Date of Patent: Apr. 10, 2018

(54) ZERO-OFFSET SAMPLING FOR CLOCK DUTY CYCLE CORRECTION

(71) Applicant: Altera Corporation, San Jose, CA (US)

(72) Inventor: Ker Yon Lau, Setia Pearl Island (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/273,920

(22) Filed: Sep. 23, 2016

(51) Int. Cl.
  *H03K 3/017* (2006.01)
  *H03K 5/156* (2006.01)
  *H03K 19/21* (2006.01)

(52) U.S. Cl.
  CPC .......... *H03K 5/1565* (2013.01); *H03K 19/21* (2013.01)

(58) Field of Classification Search
  None
  See application file for complete search history.

(56) References Cited

U.S. PATENT DOCUMENTS

| 9,030,244 | B1 | 5/2015 | Luo et al. | |
|---|---|---|---|---|
| 2004/0189364 | A1* | 9/2004 | Lee | H03K 5/1565 327/175 |
| 2008/0309375 | A1 | 12/2008 | Schnarr | |
| 2015/0097603 | A1 | 4/2015 | Amirkhany et al. | |
| 2015/0222254 | A1 | 8/2015 | Walker | |
| 2015/0295564 | A1 | 10/2015 | Jones et al. | |
| 2016/0269013 | A1* | 9/2016 | Lim | H04N 5/378 |

OTHER PUBLICATIONS

PCT International Search Report for PCT Application No. PCT/US2017/051172 dated Dec. 20, 2017; 11 Pages.

* cited by examiner

*Primary Examiner* — Long Nguyen
(74) *Attorney, Agent, or Firm* — Fletcher Yoder P.C.

(57) ABSTRACT

Duty cycle sampling circuitry is disclosed that may generate offsets that cancel each other out, thereby improving the accuracy of duty cycle sampling of input clock signals based on sampling clock signals. The input clock input signals may be swapped, or the sampling clock signals may be swapped, or both may be swapped, at various times. Erroneous samples obtained in one configuration can cancel out other erroneous samples obtained in another configuration.

21 Claims, 14 Drawing Sheets

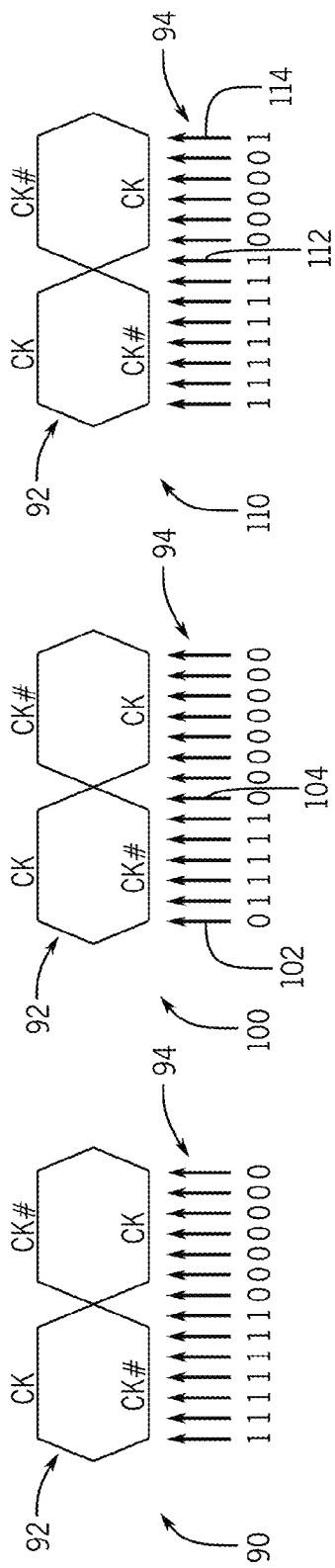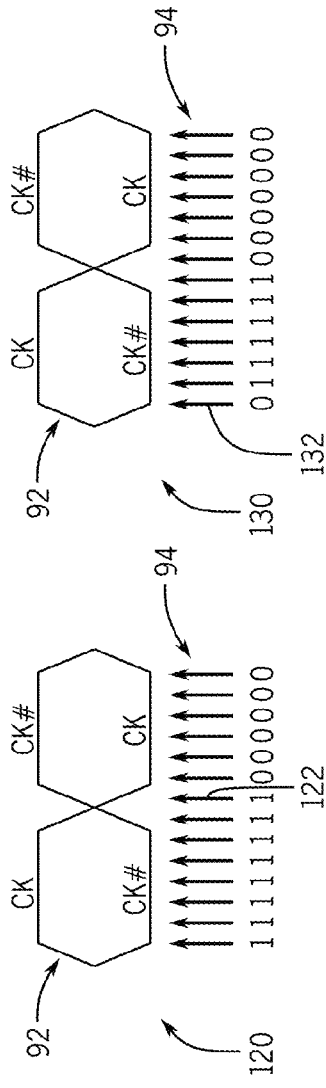

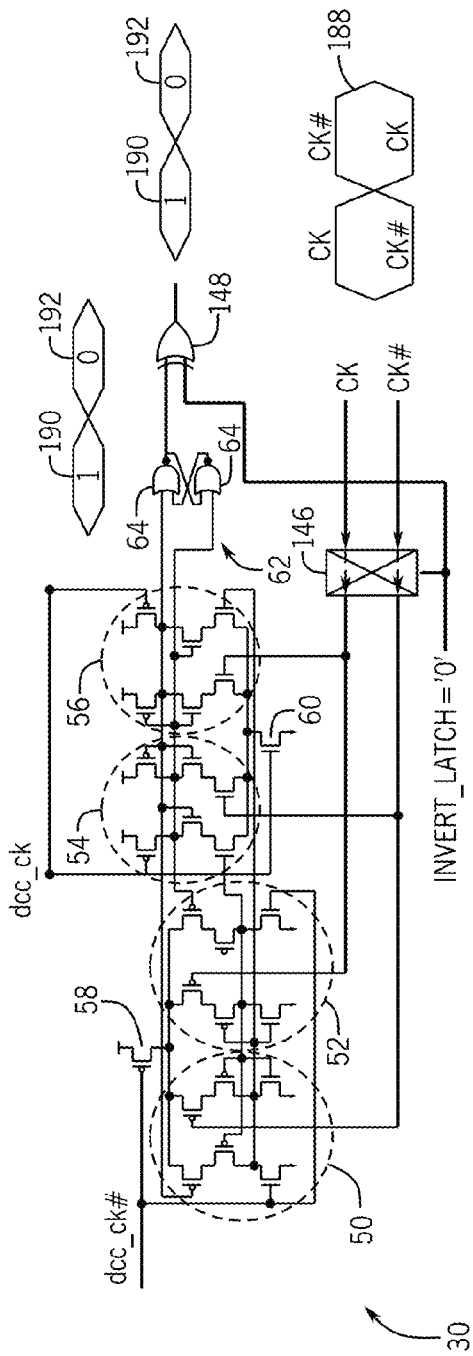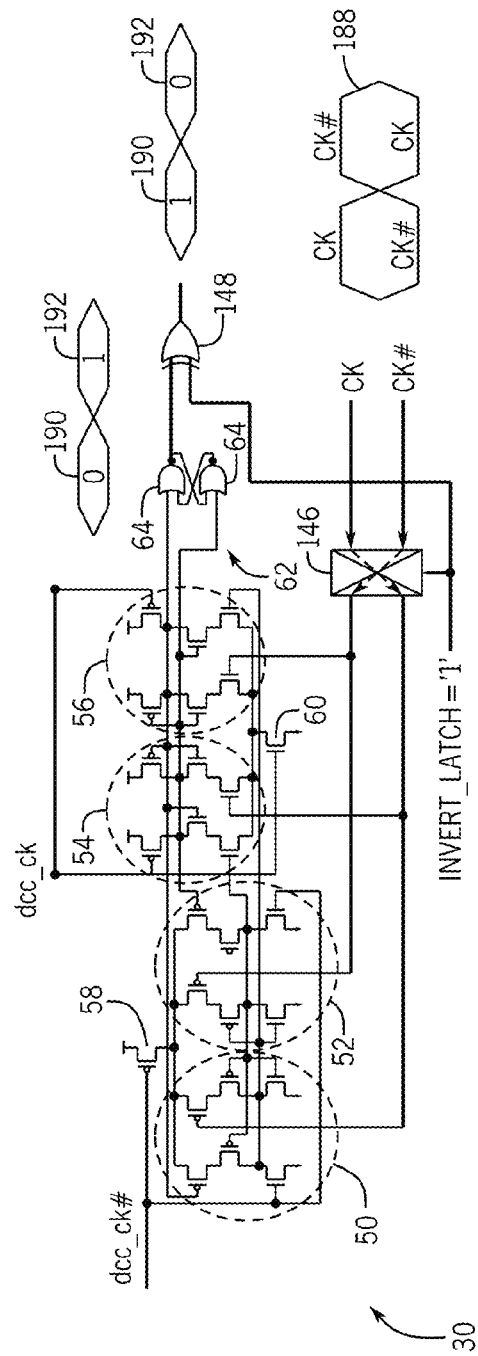

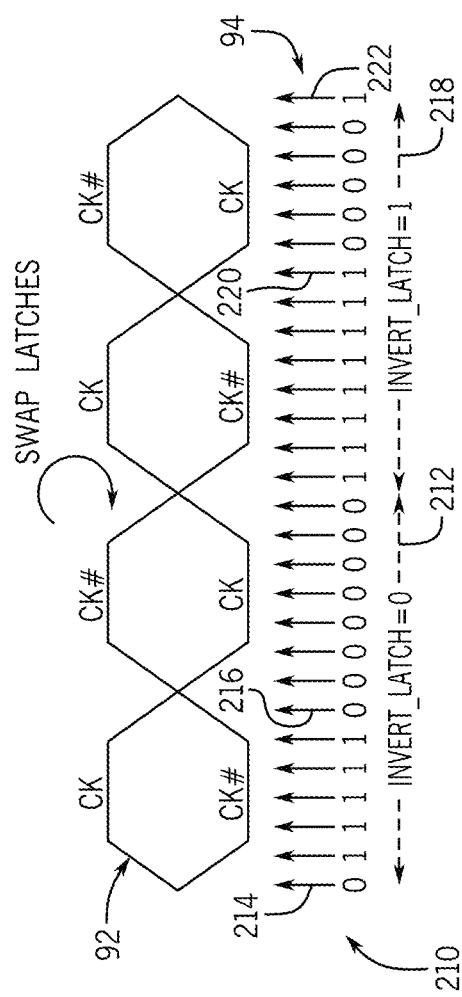

US 9,941,871 B1

ZERO-OFFSET SAMPLING FOR CLOCK DUTY CYCLE CORRECTION

BACKGROUND

This disclosure relates to clock duty cycle sampling that negates the effect of non-ideal sampling circuits or non-ideal sampling clock signals.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

An electronic device may transmit and receive data between various internal components as well as to other electronic devices based on rising and/or falling edges of clock signals. The circuitry of the electronic device that transmits or receives the data may depend on a relatively stable duty cycle of the clock signal for proper operation. In many cases, for instance, a clock signal may be specified to have a duty cycle of 50%. Since the duty cycle of a clock signal is the ratio of the pulse duration to the pulse period, this means that a clock signal with a 50% duty cycle may be in a HIGH logic state (e.g., 1) for half of the signal period and in a LOW logic state (e.g., 0) for the other half of the signal period. Signals that are in a HIGH logic state for more than half of the signal period have duty cycle above 50%, while signals that are in a LOW logic state for more than half of the signal period have duty cycles below 50%. It should be noted that different circuitry may specify different duty cycles; while a 50% duty cycle may be specified for certain types of circuitry, other duty cycles may be used by other types of circuitry.

Many high-speed circuits use both the rising and the falling edges of the clock signal for timing and may use a clock signal with a 50% duty cycle. Circuits that rely on both clock edges include double-data-rate (DDR) circuitry that includes data circuitry and memory devices, as well as half-rate clock and data recovery (CDR) circuits. If the duty cycle of the clock signal in the circuits is not equal to 50%, the circuits may function improperly owing to timing errors. To maintain a 50% clock duty cycle, duty cycle correction circuits may be used to sample the clock signal to identify the duty cycle and adjust the duty cycle appropriately. Yet the circuits that sample the duty cycle of the clock signals may suffer from process, voltage, and temperature variations that could lead to inaccurate duty cycle measurements and correction.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Maintaining a particular duty cycle may involve sampling the duty cycle of the clock signal and adjusting the clock signal to keep the desired duty cycle. Sampling the duty cycle of the clock signal may involve using duty cycle sampling circuitry clocked to a sampling clock to obtain multiple samples at different phases of the clock signal. Over time, enough samples of the clock signal may be obtained to identify how often the clock signal is in a HIGH logic state and how often the clock signal is in a LOW logic state. The relationship of the number of samples indicating a HIGH logic state over the total number of samples is the duty cycle. For example, if 28 samples of different phases of the clock signal are gathered over some period of time, and 14 of the samples indicate the clock signal is in a HIGH logic state, and 14 of the samples indicate that the clock signal is in a LOW logic state, the clock signal has a duty cycle of 50%.

Yet this form of sampling may be susceptible to certain offset errors. An offset error occurs when the clock signal is erroneously detected to be in a logical HIGH state when the clock signal is actually in a logical LOW state, or vice versa. Imperfections of the sampling circuitry or the sampling clock could lead to these offsets. As will be discussed further below, the impact of imperfect circuitry or an imperfect sampling clock can be mitigated by performing duty cycle sampling of the clock signal in a way that causes offsets to cancel out over the sampling period.

Indeed, duty cycle sampling circuitry is disclosed that may generate offsets that cancel each other out, thereby improving the accuracy of duty cycle sampling of input clock signals based on sampling clock signals. The input clock input signals may be swapped, or the sampling clock signals may be swapped, or both may be swapped, at various times. Erroneous samples obtained in one configuration can cancel out other erroneous samples obtained in another configuration. This may result in a zero-offset set of duty cycle samples, even when the duty cycle sampling circuitry is non-ideal.

Various refinements of the features noted above may be made in relation to various aspects of the present disclosure. Further features may also be incorporated in these various aspects as well. These refinements and additional features may be made individually or in any combination. For instance, various features discussed below in relation to one or more of the illustrated embodiments may be incorporated into any of the above-described aspects of the present invention alone or in any combination. Again, the brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which:

FIG. 5 is a sampling diagram representing sampling using ideal duty cycle sampling circuitry and an ideal duty cycle sampling clock, in accordance with an embodiment;

FIG. 6 is a sampling diagram representing erroneous sampling caused by a positive sampling offset due to non-ideal duty cycle sampling circuitry, in accordance with an embodiment;

FIG. 7 is a sampling diagram representing erroneous sampling caused by a negative sampling offset due to non-ideal duty cycle sampling circuitry, in accordance with an embodiment;

FIG. 8 is a sampling diagram representing erroneous sampling caused by a positive sampling offset due to a non-ideal duty cycle sampling clock, in accordance with an embodiment;

FIG. 9 is a sampling diagram representing erroneous sampling caused by a negative sampling offset due to a non-ideal duty cycle sampling clock, in accordance with an embodiment;

FIG. 15 is a diagram illustrating effects of operating the duty cycle sampling circuitry when the sampling latches are not inverted, in accordance with an embodiment;

FIG. 16 is a diagram illustrating effects of operating the duty cycle sampling circuitry when the sampling latches are inverted, in accordance with an embodiment;

FIG. 17 is a sampling diagram illustrating that a sampling offset in a positive direction can be canceled out by inverting the sampling latches and obtaining a corresponding offset in a negative direction, in accordance with an embodiment;

DETAILED DESCRIPTION OF SPECIFIC EMBODIMENTS

Figure 1:
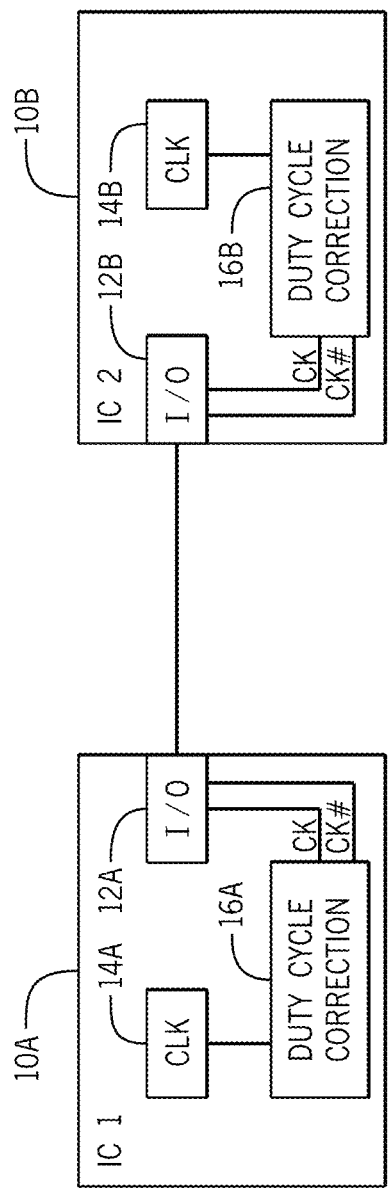
FIG. 1 is a block diagram showing communication between integrated circuits that is facilitated by duty cycle correction with zero-offset sampling, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

Numerous electronic circuits use clock signals with carefully tuned duty cycles. Although a 50% duty cycle may be most familiar, in which the clock signal is in a HIGH logic state for half of the signal period and in a LOW logic state for the other half of the signal period, some circuits use other duty cycles. It may be valuable to monitor and adjust the duty cycle of a clock signal to maintain a specified duty ratio. For example, duty data rate (DDR) devices may follow precise duty cycle constraints. For instance, these devices may use high-speed circuits that latch to both rising and falling edges of the clock signal. To maintain proper timing in these circuits, the duty cycle may be maintained at 50%.

Maintaining a particular duty cycle may involve sampling the duty cycle of the clock signal and adjusting the clock signal to keep the desired duty cycle. Sampling the duty cycle of the clock signal may involve using duty cycle sampling circuitry clocked to a sampling clock to obtain multiple samples at different phases of the clock signal. Over time, enough samples of the clock signal may be obtained to identify how often the clock signal is in a HIGH logic state and how often the clock signal is in a LOW logic state. The relationship of the number of samples indicating a HIGH logic state over the total number of samples is the duty cycle. For example, if 28 samples of different phases of the clock signal are gathered over some period of time, and 14 of the samples indicate the clock signal is in a HIGH logic state, and 14 of the samples indicate that the clock signal is in a LOW logic state, the clock signal has a duty cycle of 50%.

Yet this form of sampling may be susceptible to certain offset errors. An offset error occurs when the clock signal is erroneously detected to be in a logical HIGH state when the clock signal is actually in a logical LOW state, or vice versa. Imperfections of the sampling circuitry or the sampling clock could lead to these offsets. As will be discussed further below, the impact of imperfect circuitry or an imperfect sampling clock can be mitigated by performing duty cycle sampling of the clock signal in a way that causes offsets to cancel out over the sampling period.

The duty cycle sampling circuitry and methods of this disclosure may be used in any suitable integrated circuit devices, such as a processor, memory, application specific integrated circuit (ASIC), and/or programmable logic device (PLD), such as a field programmable gate array (FPGA). One example appears in FIG. 1, in which an integrated circuit device 10A may communicate with another integrated circuit device 10B through input/output (I/O) modules 12A and 12B. For certain high-speed communication, the I/O modules 12A and 12B may use double-data-rate (DDR) data clock cycle. Clock generation circuitry 14A and/or 14B provide a clock signal CLK to duty cycle correction circuitry 16A and 16B to generate a clock signal CK and a complementary clock signal CK# that can be used by the I/O modules 12A and 12B (and/or other circuitry of the integrated circuit devices 10A and 10B). The duty cycle correction circuitry 16A and/or 16B may use duty cycle sampling to generate the clock signal CK and the complementary clock signal CK# according to any suitable duty cycle. For example, the duty cycle correction circuitry 16A and/or 16B may generate the clock signal CK and the complementary clock signal CK# to have a duty cycle of 50%.

Figure 2:
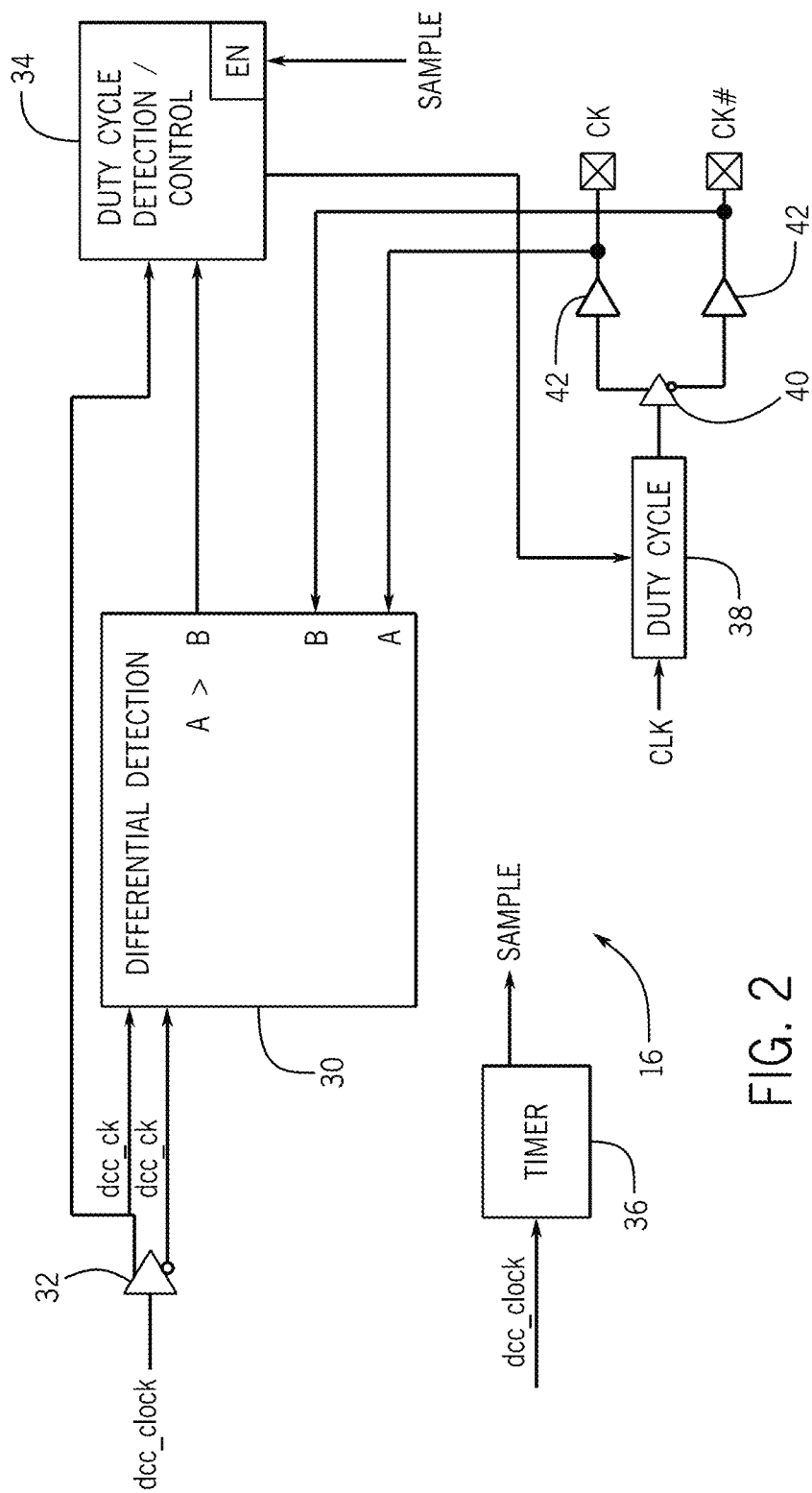
FIG. 2 is a block diagram of duty cycle sampling circuitry, in accordance with an embodiment.

One example of duty cycle correction circuitry 16 is shown in FIG. 2. The duty cycle correction circuitry 16 may adjust the duty cycle of the output clock signal CK and its complement, the complementary clock signal CK#, by identifying the duty cycle of these signals and adjusting them until the desired duty cycle is achieved. The duty cycle correction circuitry 16 may sample the duty cycle of the clock signal CK and the complementary clock signal CK# by differentially comparing these signals in differential detection circuitry 30. The differential detection circuitry 30 may output a first logical state (e.g., a logical HIGH signal or a logical LOW signal) when the input clock signal CK is sampled to be a higher value than the complementary clock signal CK#, and an opposite logical state (e.g., a logical LOW signal or a logical HIGH signal) otherwise. For ease of explanation, the differential detection circuitry 30 will be described below as outputting a logical HIGH signal when the signal CK is sampled to be higher and a logical LOW signal otherwise, but it should be appreciated that in other examples, the differential detection circuitry 30 may use any suitable logical states.

The differential detection circuitry 30 may sample whether the clock signal CK is higher than the complementary clock signal CK# based on a duty cycle sampling clock DCC_CK and its complement DCC_CK#. In one example, upon a rising edge of the duty cycle sampling clock DCC_CK, the differential detection circuitry 30 may identify, at that moment, whether the clock signal CK is higher than the clock signal CK#. If so, the differential detection circuitry 30 may output the first logical state (e.g., a logical HIGH signal). If the clock signal CK is not higher than the clock signal CK# at the rising edge of the duty cycle sampling clock DCC_CK, the differential detection circuitry 30 may output the second logical state (e.g., a logical LOW signal). The duty cycle sampling clock DCC_CK and its complement DCC_CK# may be derived from a fundamental duty cycle sampling clock dcc_clock using a buffer 32. The fundamental duty cycle sampling clock dcc_clock may be generated using any suitable circuitry, such as an oscillator and delay circuit. The duty cycle sampling clock itself may have a duty ratio of 50%. Thus, the duty cycle sampling clock DCC_CK and its complement DCC_CK# may be high and low for equal amounts of time within the duty cycle sampling clock signal period.

The output of the differential detection circuitry 30 may be provided to duty cycle detection and control circuitry 34. The duty cycle or detection control circuitry 34 may be enabled by a SAMPLE signal generated by a timer 36 that is based on the fundamental duty cycle sampling clock dcc_clock. The SAMPLE signal may define a start and end of a sampling period over which duty cycle samples are collected. During the sampling period, a desired number of duty cycle sampling clock DCC_CK periods may take place, causing the differential detection circuitry 30 to sample the clock signal CK and the complementary clock signal CK# the desired number of times. The duty cycle detection and control circuitry 34 may count the number of samples that have the first logical state to infer the duty cycle of the clock signal CK and the complementary clock signal CK#. Based on this count, the duty cycle detection and control circuitry 34 may provide duty cycle feedback to clock duty cycle adjustment circuitry 38. The duty cycle feedback provided to the clock duty cycle adjustment circuitry 38 may be any suitable signal that causes the clock duty cycle adjustment circuitry 38 to increase or decrease the length of time that the clock signal CK and the complementary clock signal CK# are logically HIGH or LOW, respectively. Based on the feedback, the clock duty cycle adjustment circuitry 38 may receive the input clock signal CLK and adjust the duty cycle to produce, through buffers 40, and 42, the clock signal CLK and the complementary clock signal CK# at the desired duty cycle.

Figure 3:
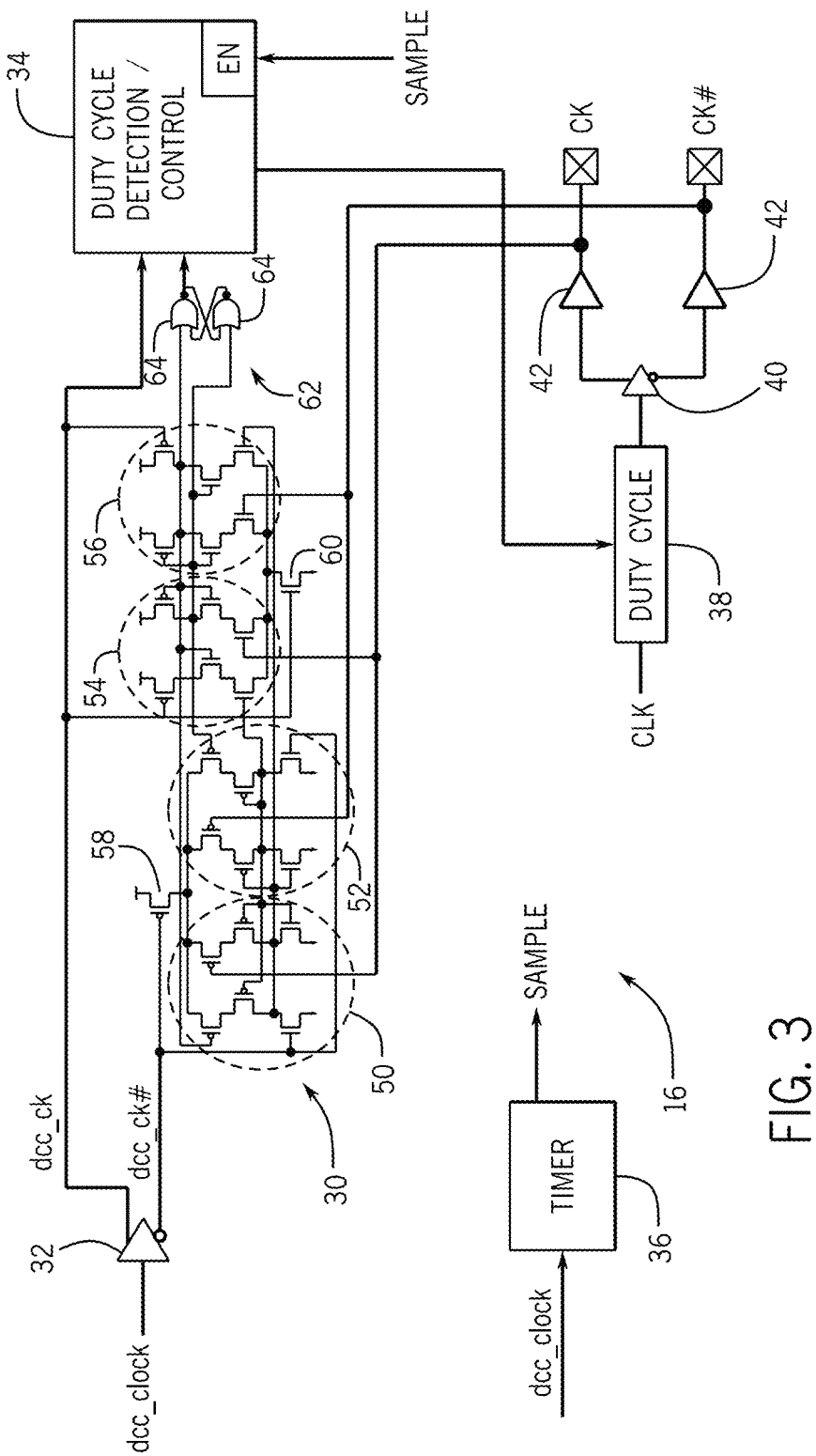
FIG. 3 is a block diagram of the duty cycle sampling circuitry that provides one example of circuitry that may be used in the sampling circuitry of FIG. 2, in accordance with an embodiment.

FIG. 3 provides a more detailed example of the type of circuitry that may serve as the differential detection circuitry 30. It should be appreciated that the circuitry shown in FIG. 3 is meant to be only one example of the type of differential detection circuitry 30 that may be used, and that any circuitry that can differentially sample whether the clock signal CK is higher than the clock signal CK# may be used. Moreover, in FIG. 3, the other components of the duty cycle correction circuitry 16 are unchanged from FIG. 2, and so are not described further.

In the example of FIG. 3, the differential detection circuitry 30 includes latches 50, 52, 54, and 56 formed using NMOS and PMOS transistors and sampling switches 58 and 60 that cause the latches 50, 52, 54, and 56 to latch upon activation. The sampling switch 60 activates on the rising edge of the duty cycle sampling clock DCC_CK and the sampling switch 58 activates upon the falling edge of its complement DCC_CK#. When the sampling switches 58 and 60 activate, the latches 50, 52, 54, and 56 measure whether the clock signal CK is higher than its complement CK# at that moment. The resulting output signal is provided to an SR latch 62. In this example, the SR latch 62 is formed using two NAND gates 64, but any suitable latching circuitry may be used. The SR latch 62 holds the output signal (indicating whether the clock signal CK is higher than its complement CK#) until the SR latch 62 is reset upon a falling edge of the duty cycle sampling clock DCC_CK and the rising edge of its complement DCC_CK#.

Figure 4:
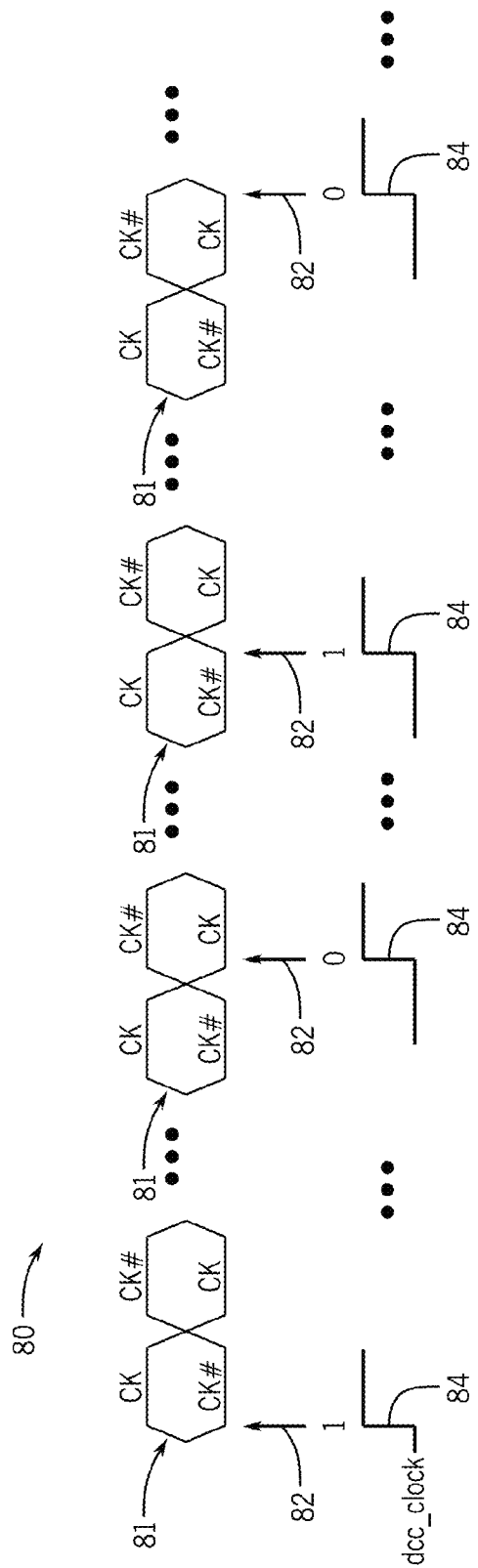
FIG. 4 is a timing diagram showing duty cycle sampling using a duty cycle sampling clock that is slower than the clock being sampled, in accordance with an embodiment.

The duty cycle correction circuitry 16 may sample the duty cycle of the clock signal CK and its complementary clock signal CK# by obtaining multiple samples from the differential detection circuitry 30 over time. Indeed, the duty cycle sampling clock dcc_clock may have a much lower frequency than the clock signal CK and its complementary clock signal CK#. As shown in FIG. 4, over time, enough samples may be obtained over enough phases of the clock signal CK and the complementary clock signal CK# to identify the duty cycle. A timing diagram 80 shown in FIG. 4 illustrates envelopes 81 of the clock signal CK and its complementary signal CK#. A differential sample 82 may be obtained (from the differential detection circuitry 30) upon a rising edge 84 of the duty cycle sampling clock DCC_CK. Since the clock signal CK and its complementary signal CK# may have a much higher frequency than the duty cycle sampling clock DCC_CK, many signal periods of the clock signal CK and its complementary signal CK# may pass between samples.

As shown by a sampling diagram 90 of FIG. 5, this allows a clock eye 92 of the clock signal CK and its complementary signal CK# to be sampled over time. The clock eye 92 represents multiple signal periods of the of the clock signal CK and its complementary signal CK# that have been superimposed. Here, a number of samples 94 have been collected over time at various phases of the clock signal to identify the duty cycle. In this example, there are seven samples indicating that the clock signal CK is higher than the complementary clock signal CK#, and seven samples indicating that the clock signal CK is lower than the complementary clock signal CK#. Therefore, the duty cycle is calculated to be 7/14, or 50%.

Yet there are imperfections that could appear in the duty cycle correction circuitry 16 that could lead to an incorrect determination of duty cycle. FIGS. 6-9 provide different examples by which erroneous samples could be obtained. In a first example shown by a sampling diagram 100 of FIG. 6, the circuitry of the differential detection circuitry 30 may be subject to process, variation, and temperature variations that could result in offsets in the differential detection circuitry 30. For instance, in the sampling diagram 100, the samples 94 of the clock eye 92 include erroneous samples 102 and 104, in which the differential detection circuitry 30 has a positive voltage offset. The positive voltage offset of the differential detection circuitry 30 in the example of FIG. 6 leads the differential detection circuitry 30 to erroneously detect that the clock signal CK is not greater than the complementary clock signal CK# on the edges of the clock eye 92. In a sample diagram 110 of FIG. 7, the opposite case is shown. Here, the samples 94 of the clock eye 92 contain erroneous samples 112 and 114 due to a negative offset in the differential detection circuitry 30. Accordingly, the detected duty cycle may be erroneous. In the case of FIG. 6, even though the duty cycle should be detected as 50%, the duty cycle is instead detected as 35.7% (5 high samples out of 14 total samples). In the case of FIG. 7 the duty cycle is erroneously detected as 64.3% (9 high samples out of 14 total samples).

Other offsets in sampling could come from variations in the duty cycle sampling clock DCC_CK. Since the differential detection circuitry 30 samples the clock signal CK in relation to the complementary signal CK# based on the timing of the duty cycle sampling clock DCC_CK, a timing offset could occur in a positive voltage offset, as shown by a sampling diagram 120 of FIG. 8, in which one of the samples 94 in the clock eye 92 is an erroneous sample 122. A sampling diagram 130 of FIG. 9 illustrates the erroneous effect of a negative timing offset. In this case, a different one of the samples 94 of the clock eye 92 is an erroneous sample 132. In the case of FIG. 8, the duty cycle is erroneously detected as 57.1% (8 high samples out of 14 total samples). In the case of FIG. 9, the duty cycle is erroneously detected as 42.9% (6 high samples out of 14 total samples).

Figure 10:
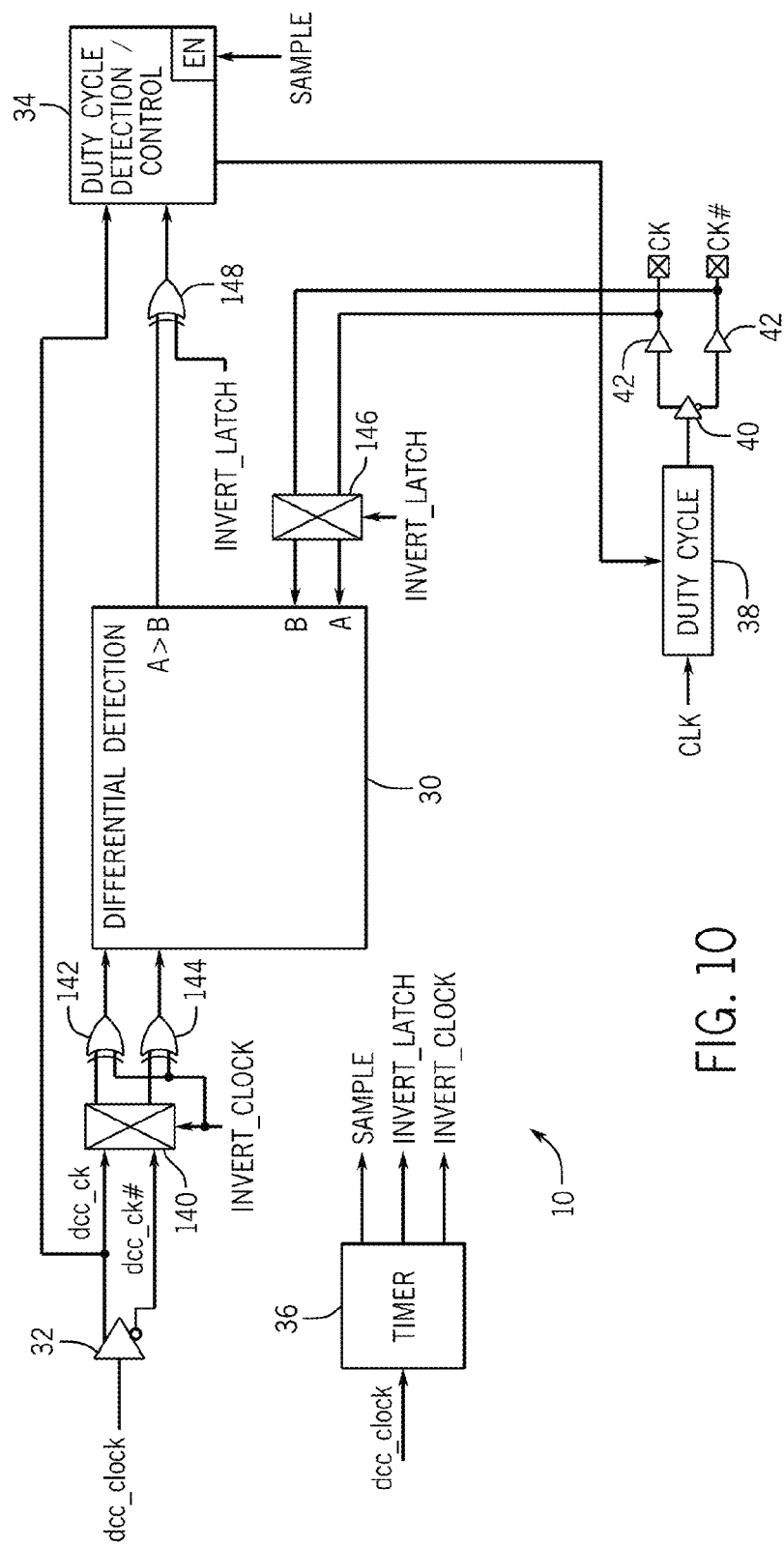
FIG. 10 is a block diagram of duty cycle sampling circuitry that reduces or eliminates offsets due to circuitry variations or sampling clock timing by canceling the effects of the offsets, even if the duty cycle sampling circuitry or the duty cycle sampling clock are non-ideal, in accordance with an embodiment.

These potential offsets may be addressed by introducing circuitry that can cause the offsets to cancel out. An example of such circuitry is shown in FIG. 10, in which the duty cycle correction circuitry 16 includes a switch box 140 and inversion circuitry 142 and 144. The inversion circuitry 142 and 144 is represented using XOR gates, but any suitable logic gates may be used. The switch box 140 allows the duty cycle sampling clock DCC_CK and its complement DCC_CK# to swap positions and be inverted at certain times to account for variations in the duty cycle of the duty cycle sampling clock DCC_CK itself.

The duty cycle correction circuitry 16 shown in FIG. 10 also includes circuitry to enable latch inversion to allow the clock signal CK and the complementary signal CK# to be sampled by different latches. In this way, if part of the circuitry of the differential detection circuitry 30 produces a positive offset, swapping the clock signal CK and the complementary signal CK# may result in a corresponding negative offset that can cancel out the positive offset. To this end, a switch box 146 and inversion circuitry 148 may be used to swap the clock signal CK and its complementary signal CK# into the differential detection circuitry 30.

In addition to the SAMPLE signal, the timer 36 may generate an INVERT_CLOCK signal and an INVERT_LATCH signal. The INVERT_CLOCK signal controls the switch box 140 and the inversion circuitry 142 and 144. The INVERT_LATCH signal controls the switch box 146 and the inversion circuitry 148. A timing diagram 160 shown in FIG. 11 provides one example of the timing of the SAMPLE signal, the INVERT_CLOCK signal, and the INVERT_LATCH signal.

Figure 11:
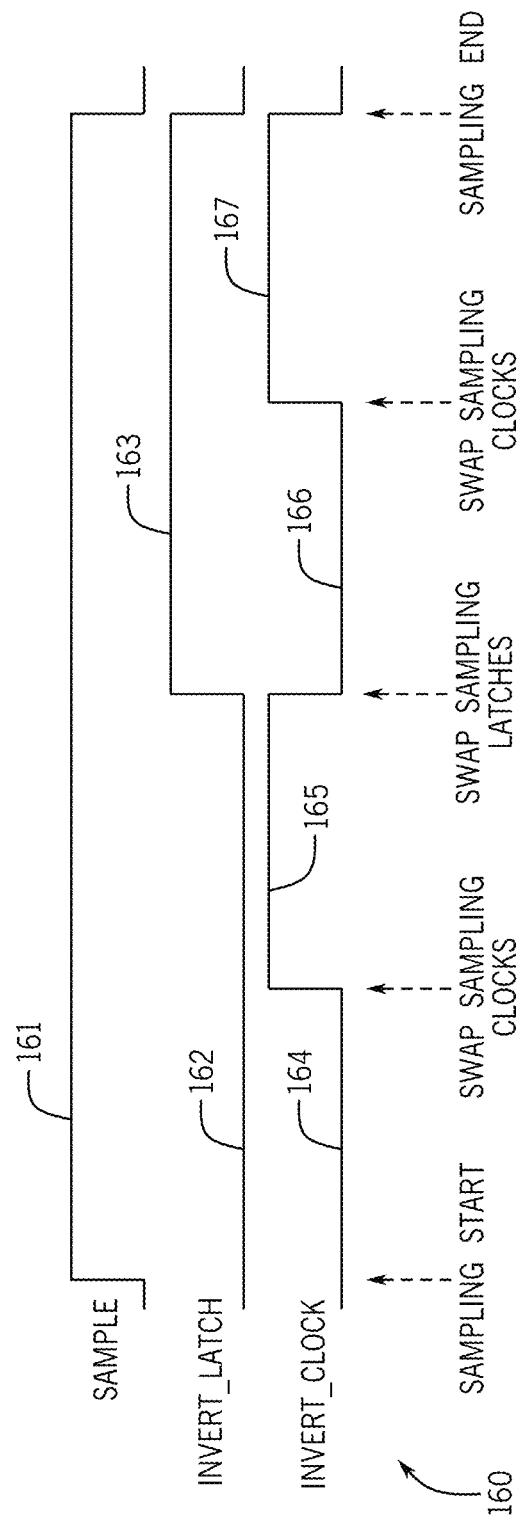
FIG. 11 is a timing diagram for swapping sampling latches of the duty cycle sampling circuitry and swapping sampling clocks to cause sampling offsets to cancel one another out, in accordance with an embodiment.

In the example of FIG. 11, the SAMPLE signal is represented as a pulse that defines a sample period 161 during which a number of duty cycle samples are obtained. The INVERT_LATCH signal may start at a logical low 162, transitioning to a logical high 163 halfway through the sample period 161. This allows the clock signal CK to be compared to the complementary clock signal CK# differentially for half of the sample period and allows the complementary clock signal CK# to be differentially compared to the clock signal CK for the other half of the sample time. The INVERT_CLOCK signal may include a logical low period 164 for half the time that the INVERT_LATCH signal is at the logical low 162 and a logical high period 165 for the other half of the time the INVERT_LATCH signal is at the logical low 162. The INVERT_CLOCK signal may also include a logical low period 166 for half the time that the INVERT_LATCH signal is at the logical high 163 and a logical high period 165 for the other half of the time the INVERT_LATCH signal is at the logical high 163. This allows the duty cycle correction sampling clock DCC_CK and its complement DCC_CK# to be swapped for half of the time that the clock signals are swapped and the half of the time when they are not.

Figure 12:
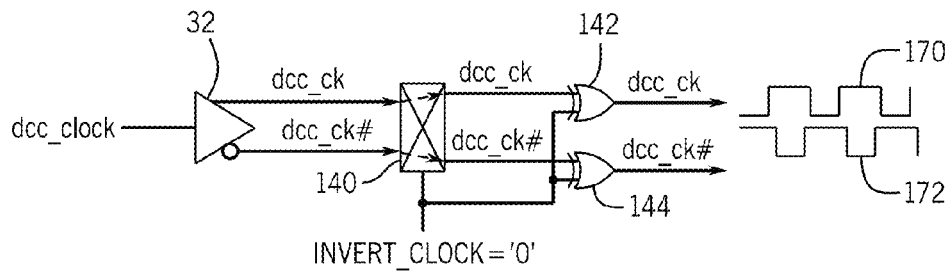
FIG. 12 is a diagram illustrating effects of operating the duty cycle sampling circuitry when the sampling clocks are not inverted, in accordance with an embodiment.
Figure 13:
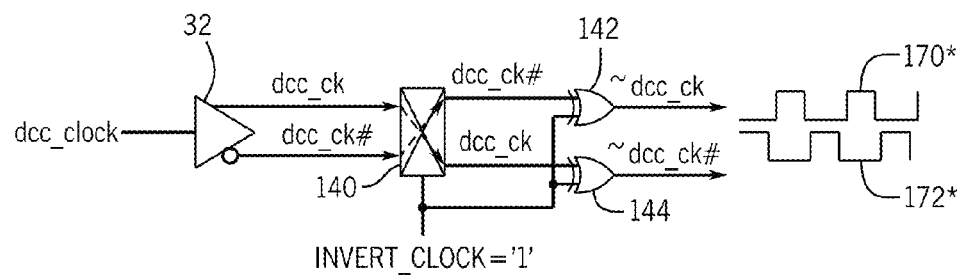
FIG. 13 is a diagram illustrating effects of operating the duty cycle sampling circuitry when the sampling clocks are inverted, in accordance with an embodiment.
Figure 14:
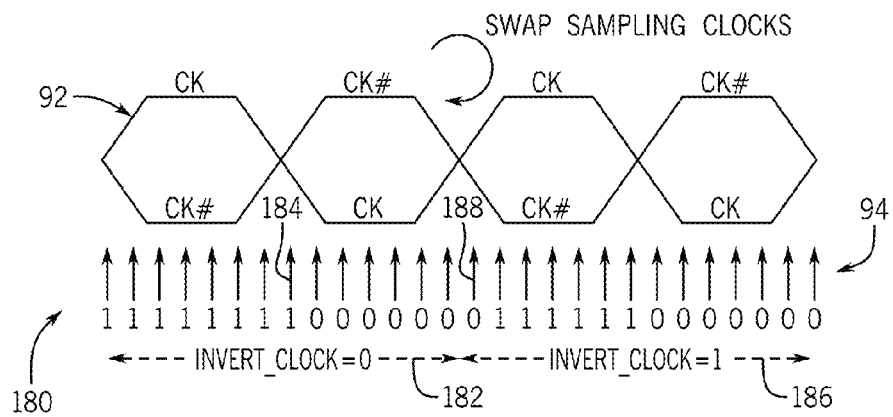
FIG. 14 is a sampling diagram illustrating that a sampling offset in a positive direction can be canceled out by inverting the sampling clocks and obtaining a corresponding offset in a negative direction, in accordance with an embodiment.

FIGS. 12-14 illustrate that inverting the sampling clock signals DCC_CK and its complement DCC_CK# can produce sampling offsets due to timing errors that cancel each other out, resulting in a more accurately identified duty cycle. As shown in FIG. 12, when the INVERT_CLOCK signal is a logical low, the switch box 140 does not invert the position of the sampling clock signals DCC_CK and its complement DCC_CK#, and the inversion circuitry 142 and 144 also do not invert these signals. In the example of FIG. 12, the duty cycle sampling clock DCC_CK is represented by a clock diagram 170, while the complementary duty cycle sampling clock DCC_CK# is represented by a clock diagram 172. As can be seen in FIG. 12, the duty cycle of the sampling clock signal DCC_CK shown by the clock diagram 170 is greater than the duty cycle of the complement of the sampling clock signal DCC_CK# shown by the clock diagram 172.

As shown in FIG. 13, when the INVERT_CLOCK signal is at a logical high, the switch box 140 swaps the location of the duty cycle sampling clock signal DCC_CK and its complement DCC_CK#, and inverts these signals with the inversion circuitry 142 and 144. This produces an inverted complementary sampling clock signal ~DCC_CK (by inverting the complementary sampling clock signal DCC_CK#) and an inverted sampling clock signal ~DCC_CK# (by inverting the sampling clock signal DCC_CK). In the example of FIG. 13, the inverted complementary duty cycle sampling clock ~DCC_CK is represented by a clock diagram 170*, while the inverted duty cycle sampling clock ~DCC_CK# is represented by a clock diagram 172*. As can be seen in FIG. 13, the duty cycle of the inverted complementary sampling clock signal ~DCC_CK shown by the clock diagram 170* is now equal to the duty cycle of the complement of the sampling clock signal DCC_CK# shown by clock diagram 172 in FIG. 12. Likewise, the duty cycle of the inverted sampling clock signal ~DCC_CK# shown by the clock diagram 172* is now equal to the duty cycle of the sampling clock signal DCC_CK shown by clock diagram 170 in FIG. 12.

Swapping the duty cycle sampling clock DCC_CK and its complement DCC_CK# in this way allows for timing offsets due to variations in the duty cycles of the duty cycle sampling clock DCC_CK and its complement DCC_CK# to cancel out. A sampling diagram 180 shown in FIG. 14 represents the impact of swapping the clocks in the manner of FIGS. 12 and 13. Namely, during a non-invert clock period 182, samples 94 of the clock eye 92 may include an erroneous sample 184 due to a positive timing offset caused by variations in the duty cycles of the duty cycle sampling clock DCC_CK and its complement DCC_CK#. This may be accounted for during an invert clock period 186 when the clocks are swapped. In the invert clock period 186, samples 94 of the clock eye 92 may include an erroneous sample 188 due to a negative timing offset caused by the inverse of the variations in the duty cycles of the duty cycle sampling clock DCC_CK and its complement DCC_CK#. The erroneous sample 184 and the erroneous sample 188 cancel each other out, resulting in a more correctly identified duty cycle.

FIGS. 15-17 illustrate that swapping the input clock signal CK and its complement CK# in the differential detection circuitry 30 can produce sampling offsets due to circuitry variations that cancel each other out, resulting in a more accurately identified duty cycle. For instance, when the INVERT_LATCH signal is a logical low, as shown in FIG. 15, the differential detection circuitry 30 operates to identify whether the clock signal CK is higher than the complementary clock signal CK#. The clock signal CK is received by latches 52 and 56 and the complementary clock signal CK# is received by latches 50 and 54. When the sampling switches 58 and 60 are activated by the duty cycle sampling clock signals DCC_CK and its complement DCC_CK#, the clock signal CK is compared to the complementary clock signal CK#. The result is provided to the SR latch 62 formed, in this example, from the NAND gates 64. When input signals are provided, the resulting output sample values from different phases are represented according to an output signal 190 and 192 (1 and 0, respectively). The values of the output signal 190 and 192 are unchanged after the inversion circuitry 148 because the inversion circuitry 148 does not invert the output signal of the SR latch 62.

On the other hand, when the INVERT_LATCH signal is set to high, as shown in FIG. 16, the switch box 146 swaps the placement of the clock signal CK and complementary clock signal CK# into differential detection circuitry 30, such that the clock signal CK now goes into the latches 50 and 54, while the complementary clock signal CK# goes into the latches 52 and 56. Thus, the differential detection circuitry 30 now operates to identify whether the complementary clock signal CK# is higher than the clock signal CK. The complementary clock signal CK# is received by latches 52 and 56 and the clock signal CK is received by latches 50 and 54. When the sampling switches 58 and 60 are activated by the duty cycle sampling clock signals DCC_CK and its complement DCC_CK#, the complementary clock signal CK# is compared to the clock signal CK. The result is provided to the SR latch 62 formed, in this example, from the NAND gates 64. When input signals are provided, the resulting output sample values from different phases are represented according to an output signal 190 and 192 (0 and 1, respectively). The values of the output signal 190 and 192 are inverted, however, after passing through the inversion circuitry 148.

The effect of swapping the placement of the clock signal CK and complementary clock signal CK# in the differential detection circuitry 30 is shown in a sampling diagram 210 of FIG. 17. Namely, the samples 94 of the clock eye 92 include erroneous samples that cancel each other out. During a latch non-inversion period 212 when the INVERT_LATCH signal is set to a logical low, erroneous samples 214 and 216 may be obtained due to a positive voltage offset in the differential detection circuitry 30. This results in the clock signal CK being detected as lower than the complementary clock signal CK#. Yet because the clocks are swapped during a latch inversion period 218 when the INVERT_LATCH signal is set to a logical high, erroneous samples 220 and 222 may be obtained due to a negative voltage offset in the differential detection circuitry 30. The erroneous samples 214 and 216 and the erroneous samples 220 and 222 cancel each other out, resulting in a more correctly identified duty cycle.

Figure 18:
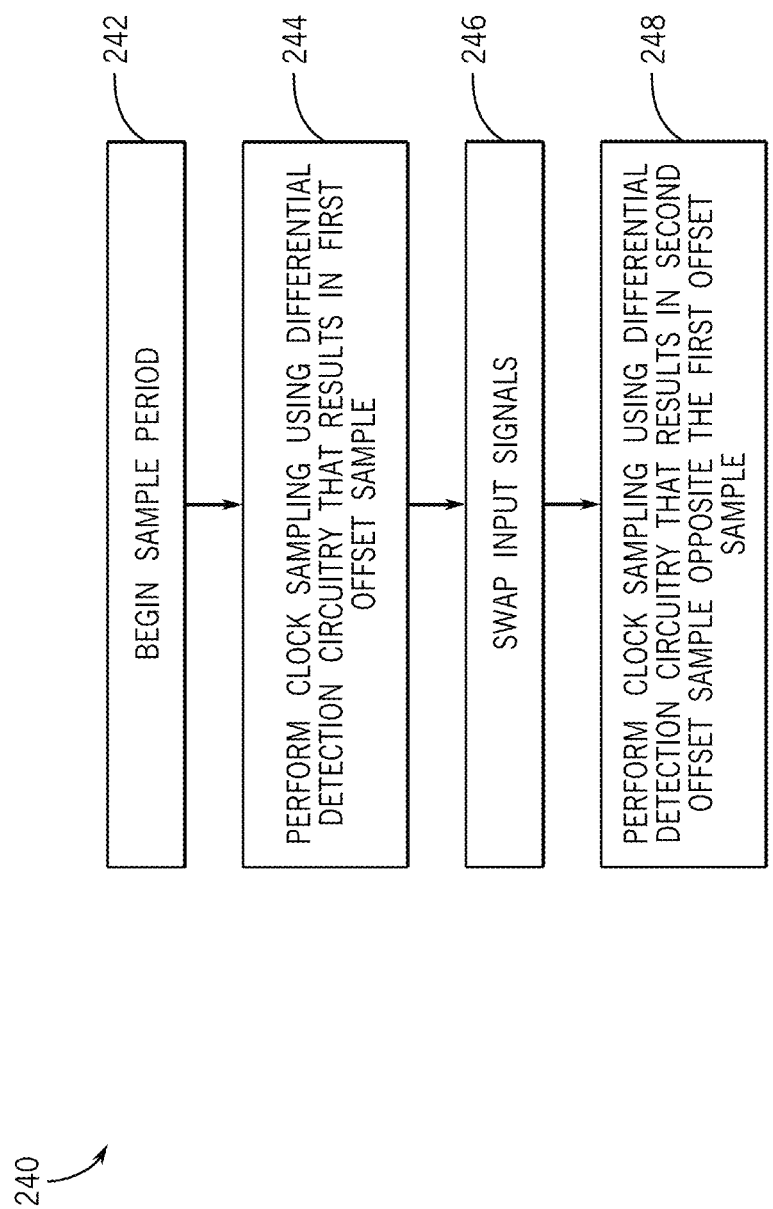
FIG. 18 is a flowchart of a method for reducing or eliminating duty cycle sampling errors with non-ideal duty cycle sampling circuitry or sampling clocks, in accordance with an embodiment.

To summarize, as shown by a flowchart 240 of FIG. 18, sampling offsets due to various imperfections used in the signals or circuitry used to sample the clock signal CK and its complement CK# may be canceled out by swapping certain input signals or sampling clock signals. Thus, a sample period may begin (block 242) and clock sampling may be performed using the differential detection circuitry 30, even when there are some imperfections that result in a first one or more erroneous samples (block 244). Input signals may be swapped (block 246). For example, the sample clock signal DCC_CK and/or the sampled clock signal clock signal CK and its complement CK#. Thereafter, clock sampling may be performed using the differential detection circuitry that, due to the imperfections of the circuitry or input signals results in a second erroneous offset sample that is opposite the first erroneous offset sample (block 248). This may result in the erroneous samples canceling each other out, resulting in a correct clock sample over the sample period.

Figure 19:
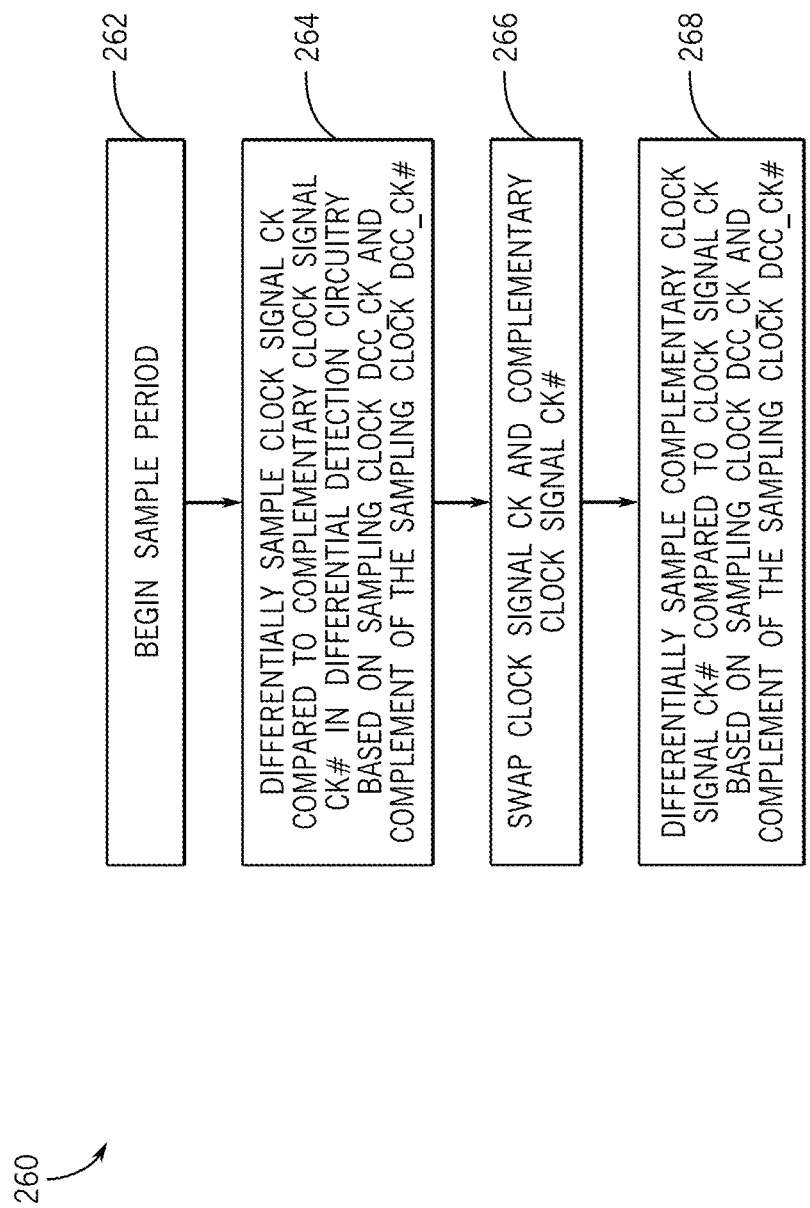
FIG. 19 is a flowchart of a method for reducing or eliminating duty cycle sampling errors with non-ideal duty cycle sampling circuitry, in accordance with an embodiment.

In one example, the input signals that are swapped may be the clock signal CK and its complement CK# to be sampled. This is shown in a flowchart 260 of FIG. 19. A sample period may begin (block 262) and the clock signal CK may be differentially sampled compared to the clock signal CK# in the differential detection circuitry (based the sampling clock DCC_CK and its complement DCC_CK# (block 264).

The clock signal CK and the complementary clock signal CK# may be swapped (block 266). To maintain the integrity of the output of the differential detection circuitry 30, the output may be inverted, or the swapped clock signals CK and the complementary clock signal CK# may be inverted instead. Thereafter, the complementary clock signal CK# may be differentially compared to the clock signal CK (based on the sampling clock DCC_CK and complement of the sampling clock DCC_CK#) (block 268). Any offsets that have occurred during the sampling of block 264 may be offset by the sampling of block 268.

Figure 20:
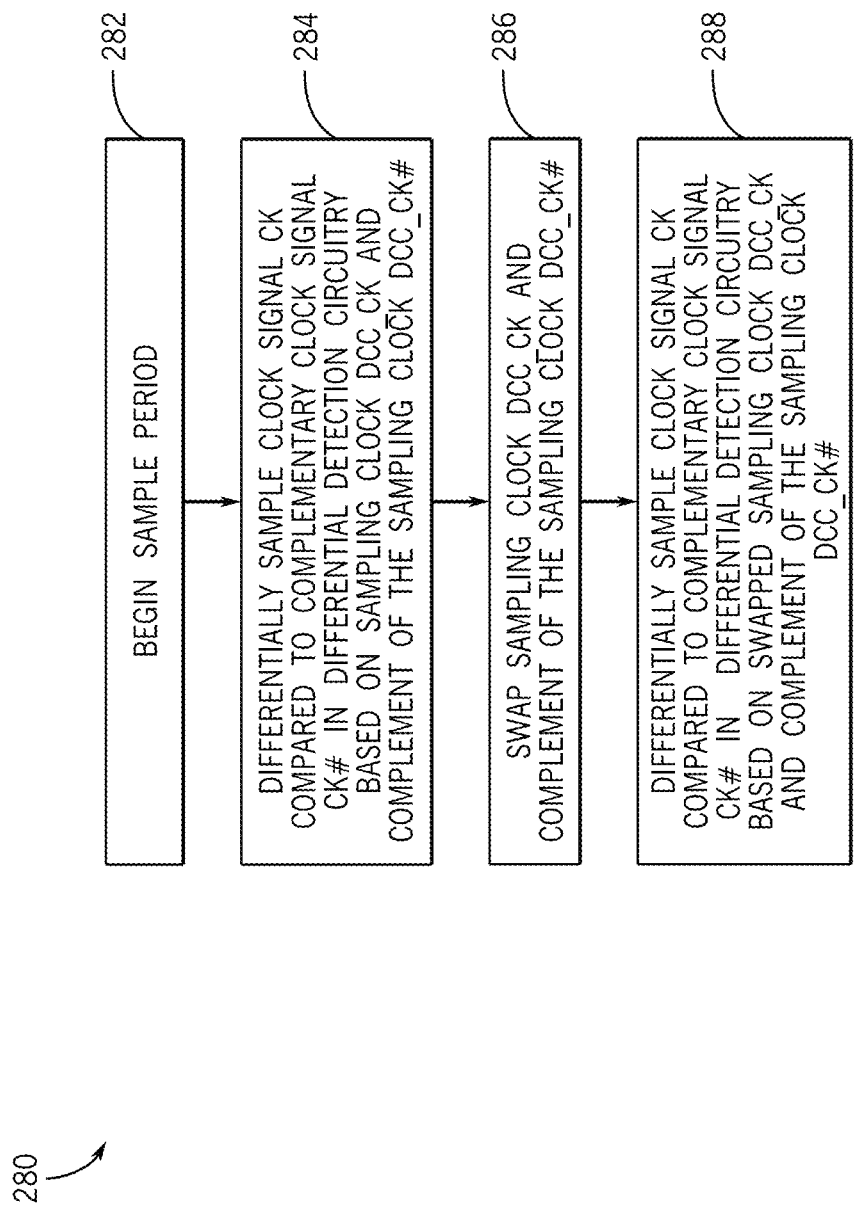
FIG. 20 is a flowchart of a method for reducing or eliminating duty cycle sampling errors with a non-ideal duty cycle sampling clock, in accordance with an embodiment.

Likewise, the sampling clock signals DCC_CK may be swapped to account for timing offsets, as shown by a flowchart 280 of FIG. 20. A sample period may begin (block 282), and clock signal CK may be differentially compared to the clock signal CK# using differential detection circuitry based on the sampling clock DCC_CK and its complement DCC_CK# (block 284). The sampling clock DCC_clock and its complement DCC_CK# may be swapped (block 286). Additionally, the now-swapped sampling clock DCC_clock and its complement DCC_CK# may be inverted or the output of the differential detection circuitry 30 may be inverted to maintain the integrity of the output of the differential detection circuitry 30. The clock signal CK may be differentially compared to the complementary clock signal CK# using the differential detection circuitry 30 (based on the now-swapped sampling clock DCC_CK and its complement DCC_CK#) (block 288). Any erroneous samples due to offsets from block 284 may be canceled by oppositely erroneous samples due from block 288.

Figure 21:
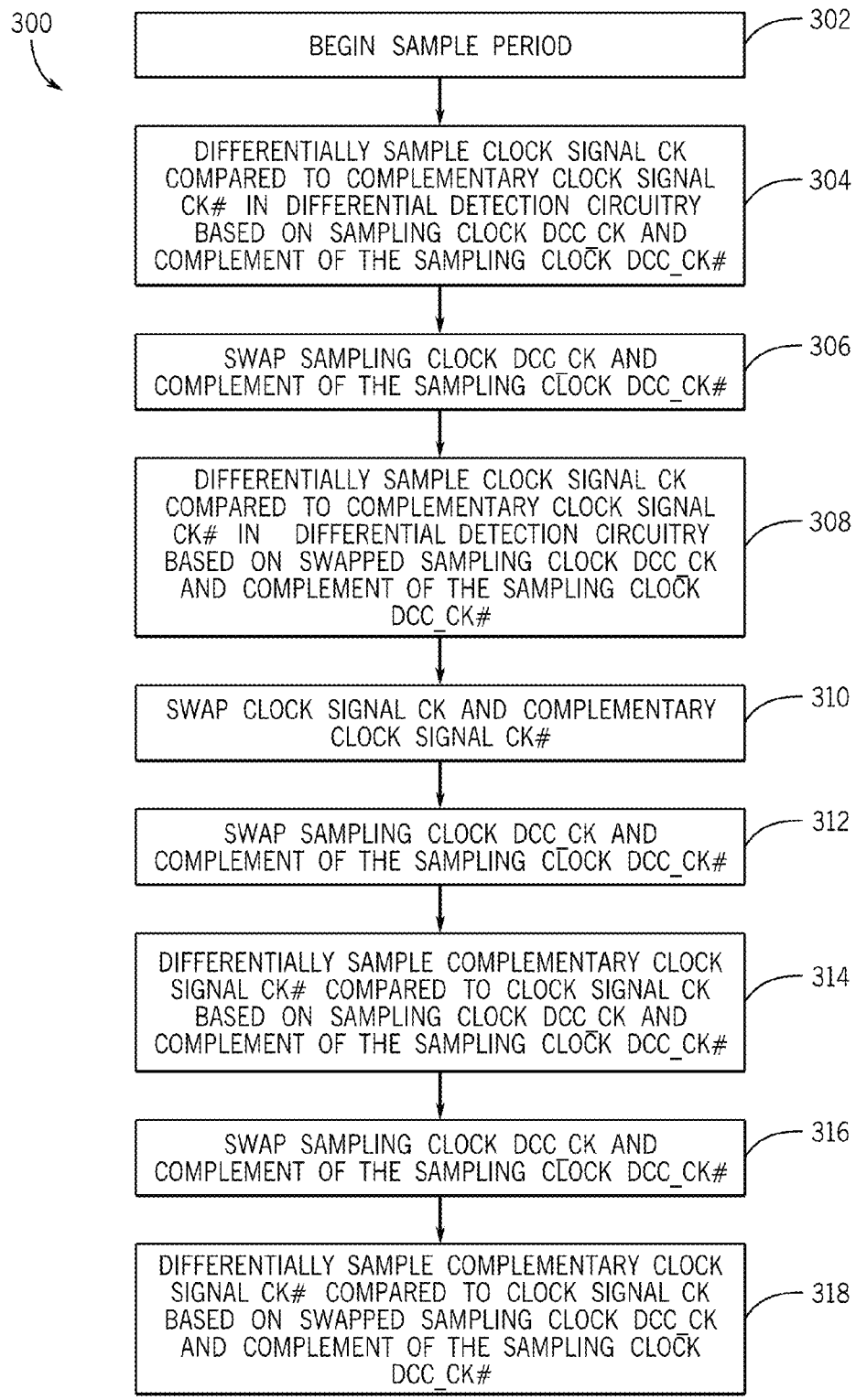
FIG. 21 is a flowchart of a method for reducing or eliminating duty cycle sampling errors with non-ideal duty cycle sampling circuitry and a non-ideal duty cycle sampling clock, in accordance with an embodiment.

As illustrated above, these techniques may also be combined. As seen in a flowchart 300 of FIG. 21, a sampling period may begin (block 302) and the clock signal CK may be differentially compared to the complementary clock signal CK# using the differential detection circuitry 30 (based on the sampling clock DCC_CK and the complement of the sampling clock DCC_CK#) (block 304). The sampling clock DCC_CK and its complement DCC_CK# may be swapped (block 306). Additionally, the now-swapped sampling clock DCC_CK and its complement DCC_CK# may be inverted or the output of the differential detection circuitry 30 may be inverted to maintain the integrity of the output of the differential detection circuitry 30. The clock CK may be sampled again by being differentially compared to the complementary clock signal CK# based on the now-swapped sampling clock DCC_CK and its complement DCC_CK# (block 308).

The clock signal CK and the complementary clock signal CK# may be swapped (block 310) and the sampling clock signal DCC_CK and its complement DCC_CK# may be swapped and de-inverted back to their original positions (block 312). To maintain the integrity of the output of the differential detection circuitry 30, the output may be inverted, or the swapped clock signals CK and the complementary clock signal CK# may be inverted instead. The complementary clock signal CK# then may be differentially compared to the clock signal CK (based on the sampling clock DCC_CK and its complement DCC_CK#) (block 314). The sampling clock DCC_CK and its complement DCC_CK# may be swapped once more (block 316). Additionally, the now-swapped sampling clock DCC_CK and its complement DCC_CK# may be inverted or the output of the differential detection circuitry 30 may be inverted to maintain the integrity of the output of the differential detection circuitry 30. The complementary clock signal CK# then may be differentially compared to the clock signal CK (based on the swapped sampling clock DCC_CK and its complement DCC_CK#) (block 318). Offsets arising in the sampling of blocks 304, 306, 308, 312, and 316 due to imperfections of the differential detection circuitry 30 or timing of the duty cycle sampling clock DCC_CK and its complement DCC_CK# thus may be canceled out. As a result, the duty cycle sampling may be more accurate. In addition, this may also allow for better yields, since the sampling circuitry may operate well despite imperfections and imperfect duty cycle sampling clocks. Indeed, the specifications for the duty cycle sampling may be relaxed even while still obtaining accurate duty cycle sampling.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An integrated circuit device comprising:
differential detection circuitry comprising:
   a first input that receives a first input signal;
   a second input that receives a second input signal, wherein the second input signal is a complement of the first input signal;
   a third input that receives a third input signal;
   a fourth input that receives a fourth input signal, wherein the fourth input signal is a complement of the third input signal; and
   an output that outputs an output signal indicating whether the third input signal is at a higher voltage level than the fourth input signal upon a state change of the first input signal and the second input signal;
counting circuitry that counts the output signal upon the state change of the first input signal and the second input signal over a first period to enable determination of a duty cycle of the third input signal and a duty cycle of the fourth input signal over the first period;
first signal routing circuitry that:
   in a first selectable configuration of the first signal routing circuitry, provides a first clock signal as the first input signal to the first input and provides a second clock signal as the second input signal to the second input; and
   in a second selectable configuration of the first signal routing circuitry, provides an inverse of the second clock signal as the first input signal to the first input and provides an inverse of the first clock signal as the second input signal to the second input; and
first timing circuitry that:
   controls the first signal routing circuitry to be in the first selectable configuration during a first portion of the first period; and
   controls the first signal routing circuitry to be in the second selectable configuration during a second portion of the first period, wherein the first portion of the first period and the second portion of the first period do not overlap in time.

2. The integrated circuit device of claim 1, wherein:
during the first portion of the first period, the differential detection circuitry outputs a first set of at least one erroneous output signals that erroneously indicate that the third input signal is at a higher voltage level than the fourth input signal; and
during the second portion of the first period, the differential detection circuitry outputs a second set of at least one erroneous output signals that erroneously indicate that the third input signal is not at a higher voltage level than the fourth input signal; and
the first set of erroneous output signals is equal in number to the second set of erroneous output signals, thereby causing the first set of erroneous output signals to be effectively canceled out by the second set of erroneous output signals.

3. The integrated circuit device of claim 1, wherein the first portion of the first period is equal in duration to the second portion of the first period.

4. The integrated circuit device of claim 1, wherein the first signal routing circuitry comprises:
- a first switch box having a first switch box input that receives the first clock signal, a second switch box input that receives the second clock signal, a first switch box output coupled to the first input of the differential detection circuitry, and a second switch box output coupled to the second input of the differential detection circuitry, wherein:
  - in the first selectable configuration of the first signal routing circuitry, the first switch box routes the first switch box input to the first switch box output and routes the second switch box input to the second switch box output; and
  - in the second selectable configuration of the first signal routing circuitry, the first switch box routes the first switch box input to the second switch box output and routes the second switch box input to the first switch box output; and
- inversion circuitry coupled to the first switch box output and the second switch box output, wherein:
  - in the first selectable configuration of the first signal routing circuitry, the inversion circuitry does not invert the first clock signal and the second clock signal; and
  - in the second selectable configuration of the first signal routing circuitry, the inversion circuitry inverts the first clock signal and the second clock signal.

5. The integrated circuit device of claim 4, wherein the inversion circuitry is located downstream of the first switch box.

6. The integrated circuit device of claim 4, wherein the inversion circuitry comprises one or more XOR gates.

7. The integrated circuit device of claim 1, comprising:
- second signal routing circuitry that:
  - in a first selectable configuration of the second signal routing circuitry, provides a third clock signal as the third input signal to the third input and provides a fourth clock signal as the fourth input signal to the fourth input; and
  - in a second selectable configuration of the second signal routing circuitry, provides the fourth clock signal as the third input signal to the third input and provides the third clock signal as the fourth input signal to the fourth input and inverts the output signal; and
- second timing circuitry that:
  - controls the second signal routing circuitry to be in the first selectable configuration during a third portion of the first period; and
  - controls the second signal routing circuitry to be in the second selectable configuration during a fourth portion of the first period, wherein the third portion of the first period and the fourth portion of the first period do not overlap in time.

8. The integrated circuit device of claim 7, wherein:
- during the third portion of the first period, the differential detection circuitry outputs a first set of at least one erroneous output signals that erroneously indicate that the third input signal is at a higher voltage level than the fourth input signal; and
- during the fourth portion of the first period, the differential detection circuitry outputs a second set of at least one erroneous output signals that erroneously indicate that the third input signal is not at a higher voltage level than the fourth input signal; and
- the first set of erroneous output signals is equal in number to the second set of erroneous output signals, thereby causing the first set of erroneous output signals to be effectively canceled out by the second set of erroneous output signals.

9. The integrated circuit device of claim 7, wherein the third portion of the first period is equal in duration to the fourth portion of the first period.

10. The integrated circuit device of claim 7, wherein:
- the third portion of the first period takes place over a first half of the first portion of the first period and over a first half of the second portion of the first period; and
- the fourth portion of the first period takes place over a second half of the first portion of the first period and over a second half of the second portion of the first period, wherein the first half of the first portion of the first period does not overlap in time with the second half of the first portion of the first period, and wherein the first half of the second portion of the first period does not overlap in time with the second half of the second portion of the first period.

11. The integrated circuit device of claim 7, wherein the second signal routing circuitry comprises:
- a second switch box having a third switch box input that receives the third clock signal, a fourth switch box input that receives the fourth clock signal, a third switch box output coupled to the third input of the differential detection circuitry, and a fourth switch box output coupled to the fourth input of the differential detection circuitry, wherein:
  - in the first selectable configuration of the second signal routing circuitry, the second switch box routes the third switch box input to the third switch box output and routes the fourth switch box input to the fourth switch box output; and
  - in the second selectable configuration of the second signal routing circuitry, the second switch box routes the third switch box input to the fourth switch box output and routes the fourth switch box input to the third switch box output; and
- inversion circuitry coupled to the output of the differential detection circuitry, wherein:
  - in the first selectable configuration of the second signal routing circuitry, the inversion circuitry does not invert the output signal; and
  - in the second selectable configuration of the second signal routing circuitry, the inversion circuitry inverts the output signal.

12. A method for duty cycle sampling comprising:
- receiving a first clock signal and a second clock signal, wherein the second clock signal is a complement of the first clock signal;
- during a first portion of a duty cycle sampling period, providing the first clock signal to a first input of differential detection circuitry, providing the second clock signal to a second input of the differential detection circuitry, and obtaining a first plurality of differential samples output by the differential detection circuitry; and
- during a second portion of the duty cycle sampling period, providing the first clock signal to the second input of the differential detection circuitry, providing the second clock signal to the first input of the differential detection circuitry, inverting an output of the differential detection circuitry, and obtaining a second plurality of differential samples output by the differential detection circuitry;

wherein erroneous samples in the first plurality of differential samples are canceled out by erroneous samples in the second plurality of differential samples.

13. The method of claim 12, wherein:

providing the first clock signal to the first input of the differential detection circuitry during the first portion of the duty cycle sampling period comprises providing the first clock signal to a first set of latches during the first portion of the duty cycle sampling period;

providing the second clock signal to the second input of the differential detection circuitry during the first portion of the duty cycle sampling period comprises providing the second clock signal to a second set of latches during the first portion of the duty cycle sampling period;

providing the first clock signal to the second input of the differential detection circuitry during the second portion of the duty cycle sampling period comprises providing the first clock signal to the second set of latches during the second portion of the duty cycle sampling period; and providing the second clock signal to the first input of the differential detection circuitry during the second portion of the duty cycle sampling period comprises providing the second clock signal to the first set of latches during the second portion of the duty cycle sampling period.

14. The method of claim 12, wherein the first portion of the duty cycle sampling period is equal in duration to the second portion of the duty cycle sampling period.

15. The method of claim 12, wherein the first plurality of differential samples is equal in number to the second plurality of differential samples.

16. A method comprising:

during a first portion of a duty cycle sampling period, operating differential detection circuitry to obtain a first set of duty cycle samples of a first clock signal at a first plurality of state changes of a sample clock signal, wherein:

the first clock signal is coupled to a first input of the differential detection circuitry;

a complement of the first clock signal is coupled to a second input of the differential detection circuitry;

the sample clock signal is coupled to a third input of the differential detection circuitry; and a complement of the sample clock signal is coupled to a fourth input of the differential detection circuitry; and during a second portion of the duty cycle sampling period, operating the differential detection circuitry to obtain a second set of duty cycle samples of the first clock signal at a second plurality of state changes of the sample clock signal, wherein during the second portion of the duty cycle sampling period the differential detection circuitry is operated according to one of the following configurations:

(A) the first clock signal is coupled to the second input of the differential detection circuitry, the complement of the first clock signal is coupled to the first input of the differential detection circuitry, and an output of the differential detection circuitry is inverted;

(B) the first clock signal is inverted upstream of the differential detection circuitry to produce an inverted first clock signal, the complement of the first clock signal is inverted upstream of the differential detection circuitry to produce an inverted complement of the first clock signal, the inverted first clock signal is coupled to the second input of the differential detection circuitry, and the inverted complement of the first clock signal is coupled to the first input of the differential detection circuitry;

(C) the sample clock signal is coupled to the fourth input of the differential detection circuitry, the complement of the sample clock signal is coupled to the third input of the differential detection circuitry, and the output of the differential detection circuitry is inverted; or (D) the sample clock signal is inverted upstream of the differential detection circuitry to produce an inverted sample clock signal, the complement of the sample clock signal is inverted upstream of the differential detection circuitry to produce an inverted complement of the sample clock signal, the inverted sample clock signal is coupled to the fourth input of the differential detection circuitry, and the inverted complement of the sample clock signal is coupled to the third input of the differential detection circuitry.

17. The method of claim 16, wherein during the second portion of the duty cycle sampling period, the differential detection circuitry is operated according to the following configuration:

the first clock signal is coupled to the second input of the differential detection circuitry;

the complement of the first clock signal is coupled to the first input of the differential detection circuitry; and the output of the differential detection circuitry is inverted; and wherein the method comprises:

during a third portion of the duty cycle sampling period, operating the differential detection circuitry to obtain a third set of duty cycle samples of the first clock signal at a third plurality of state changes of the sample clock signal, wherein:

the first clock signal is coupled to the second input of the differential detection circuitry, the complement of the first clock signal is coupled to the first input of the differential detection circuitry, and an output of the differential detection circuitry is inverted; and the sample clock signal is inverted upstream of the differential detection circuitry to produce the inverted sample clock signal, the complement of the sample clock signal is inverted upstream of the differential detection circuitry to produce the inverted complement of the sample clock signal, the inverted sample clock signal is coupled to the fourth input of the differential detection circuitry, and the inverted complement of the sample clock signal is coupled to the third input of the differential detection circuitry.

18. The method of claim 17, comprising, during a fourth portion of the duty cycle sampling period, operating the differential detection circuitry to obtain a fourth set of duty cycle samples of the first clock signal at a fourth plurality of state changes of the sample clock signal state changes, wherein:

the first clock signal is coupled to the first input of the differential detection circuitry, the complement of the first clock signal is coupled to the second input of the differential detection circuitry, and the output of the differential detection circuitry is not inverted; and the sample clock signal is inverted upstream of the differential detection circuitry to produce the inverted sample clock signal, the complement of the sample clock signal is inverted upstream of the differential detection circuitry to produce the inverted complement of the sample clock signal, the inverted sample clock signal is coupled to the fourth input of the differential detection circuitry, and the inverted complement of the sample clock signal is coupled to the third input of the differential detection circuitry.

19. The method of claim 18, wherein the first portion of the duty cycle sampling period, the second portion of the duty cycle sampling period, the third portion of the duty cycle sampling period, and the fourth portion of the duty cycle sampling period are all equal in duration and do not overlap in time.

20. The method of claim 18, wherein at least two duty cycle samples of the first set of duty cycle samples, the second set of duty cycle samples, the third set of duty cycle samples, or the fourth set of duty cycle samples contain errors of equal and opposite value and therefore those errors cancel each other out.

21. The method of claim 18, wherein the first portion of the duty cycle sampling period, the second portion of the duty cycle sampling period, the third portion of the duty cycle sampling period, and the fourth portion of the duty cycle sampling period occur sequentially in that order.

* * * * *